(12) United States Patent
Dyer et al.

(10) Patent No.: US 6,794,242 B1
(45) Date of Patent: Sep. 21, 2004

(54) EXTENDIBLE PROCESS FOR IMPROVED TOP OXIDE LAYER FOR DRAM ARRAY AND THE GATE INTERCONNECTS WHILE PROVIDING SELF-ALIGNED GATE CONTACTS

(75) Inventors: Thomas W. Dyer, Pleasant Valley, NY (US); Andreas Knorr, Fishkill, NY (US); Laertis Economikos, Wappingers Falls, NY (US); Scott Halle, Hopewell Junction, NY (US); Rajeev Malik, Pleasantville, NY (US); Norbert Arnod, Chestnut Ridge, NY (US)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 45 days.

(21) Appl. No.: 09/675,435

(22) Filed: Sep. 29, 2000

(51) Int. Cl.[7] ............................... H01L 21/8242
(52) U.S. Cl. ............... 438/244; 438/248; 438/270
(58) Field of Search ............... 438/243, 244, 438/248, 270, 386, 387, 391, 589

(56) References Cited

U.S. PATENT DOCUMENTS

| | | | | |
|---|---|---|---|---|
| 5,937,292 A | * | 8/1999 | Hammerl et al. | 438/243 |
| 6,090,661 A | * | 7/2000 | Perng et al. | 438/248 |
| 6,091,094 A | * | 7/2000 | Rupp | 438/243 |
| 6,100,131 A | * | 8/2000 | Alsmeier | 438/248 |

FOREIGN PATENT DOCUMENTS

| | | |
|---|---|---|
| EP | 0 333 426 A2 | 9/1989 |
| EP | 1 077 487 A2 | 2/2001 |
| JP | 62002660 | 7/1988 |
| WO | WO 00/67326 | 11/2000 |

* cited by examiner

*Primary Examiner*—Chandra Chaudhari
(74) *Attorney, Agent, or Firm*—Lerner, David, Littenberg, Krumholz & Mentlik, LLP

(57) ABSTRACT

A Top Oxide Method is used to form an oxide layer over an array of vertical transistors as in a trench dynamic random access memory (DRAM) array with vertically stacked access metal oxide semiconductor field effect transistors (MOSFETs). The Top Oxide is formed by first forming the vertical devices with the pad nitride remaining in place. Once the devices have been formed and the gate polysilicon has been planarized down to the surface of the pad nitride, the pad nitride is stripped away leaving the tops of the gate polysilicon plugs extending above the active silicon surface. This pattern of polysilicon plugs defines the pattern over which the Top Oxide is deposited. The deposited Top Oxide fills the regions between and on top of the polysilicon plugs. The Top Oxide is than planarized back to the tops of the polysilicon plugs so contacts can be made between the passing interconnects and the gates of the vertical devices. The Top Oxide layer serves to separate the passing interconnects from the active silicon thereby reducing capacitive coupling between the two levels and providing a robust etch-stop layer for the reactive ion etch (RIE) patterning of the subsequent interconnect level.

14 Claims, 13 Drawing Sheets

EXTENDIBLE PROCESS FOR IMPROVED TOP OXIDE LAYER FOR DRAM ARRAY AND THE GATE INTERCONNECTS WHILE PROVIDING SELF-ALIGNED GATE CONTACTS

BACKGROUND OF THE INVENTION

1. Field of the Invention

The present invention generally relates to the manufacture of integrated circuits (ICs) with vertical metal oxide semiconductor field effect transistors (MOSFETs) and, more particularly, to methods for forming a silicon dioxide layer over an array of vertical MOSFETs. The oxide layer serves to separate and electrically insulate the vertical devices from the overpassing interconnect wiring while allowing for self-aligned contacts to be made between the interconnects and the gates of the vertical MOSFETs.

2. Background Description

We propose a method (which we call the "Top Oxide Method") for forming the oxide layer over an array of vertical transistors, as in a trench DRAM array, in which the access transistors are vertically stacked above the trench capacitors. An insulating layer is needed on top of the active silicon to reduce capacitive coupling between the passing interconnects and the underlying semiconductor components. It is also needed to provide a robust etch stop layer for the reactive ion etch (RIE) patterning of the subsequent interconnect level. Oxide is preferred over silicon nitride since it has a lower dielectric constant and since it allows for standard processing of the self-aligned source junction contacts. This insulating layer must also allow for electrical contact to be made between the passing interconnects and the vertical transistor gates. In addition, the thickness of the layer should be freely adjustable for flexibility in engineering its electrical and structural properties. The process sequence for forming the oxide layer should also permit the implementation of other features such as vertical gate pull-back and vertical gate nitride spacers. The process should also be extendible to shrinking feature sizes.

SUMMARY OF THE INVENTION

It is an object of the present invention to provide a method (Top Oxide Method) for forming an insulating layer (Top Oxide) over a vertical device array that satisfies the criteria mentioned above.

According to the method of this invention, the vertical MOSFETs and any underlying structures, such as deep trench capacitors, are formed with a pad nitride in place. Then, after the gate oxide and vertical gate polycrystalline silicon (polysilicon) conductor are formed, any materials deposited on the top of the pad nitride are removed with the polysilicon gate conductor protecting the structures inside the vertical device recess. The gate polysilicon could then be further planarized (e.g., using a chemical-mechanical polish (CMP)) down to the pad nitride, if desired. Once the top surface of the pad nitride is cleared and the gate polysilicon is planarized as desired, the pad nitride is etched away selective to the polysilicon gate conductor and pad oxide which covers the silicon surface. Then, the Top Oxide is deposited. This oxide covers the polysilicon gate plugs that extend above the silicon surface and fills the spaces in between. This oxide is then CMP planarized or otherwise etched back to the tops of the polysilicon plugs.

The resulting structure is a square edged oxide surrounding the gate polysilicon plugs. This square edge makes the process extendible to shrinking ground rules. The Top Oxide thickness is freely adjustable since it is determined solely by the pad nitride thickness that can be increased or decreased as needed. In addition, this method lends itself to additional process options such as a vertical gate pull-back, vertical gate nitride sidewall spacers, and a TTO nitride liner.

In an alternate sequence, the isolation trenches (ITs) can be formed before the Top Oxide is deposited. In this sequence, the pad nitride is kept in place after the vertical devices have been formed and it is used for IT processing. This pad nitride is stripped after the ITs have been etched, filled, and planarized down to this pad nitride. After the pad nitride is stripped, the Top Oxide would be deposited and planarized down to the tops of the gate polysilicon plugs in a manner similar to that of the original sequence.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
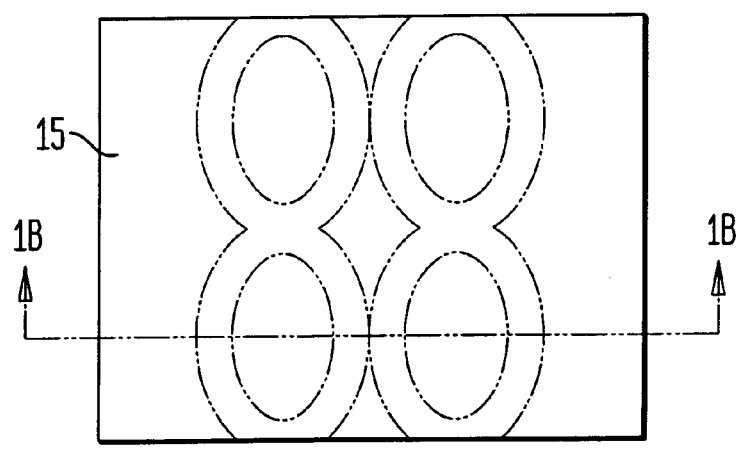
FIGS. 1A and 1B are, respectively, a top view and a cross-sectional view showing the structure after depositing the TTO HDP.
Figure 1B:
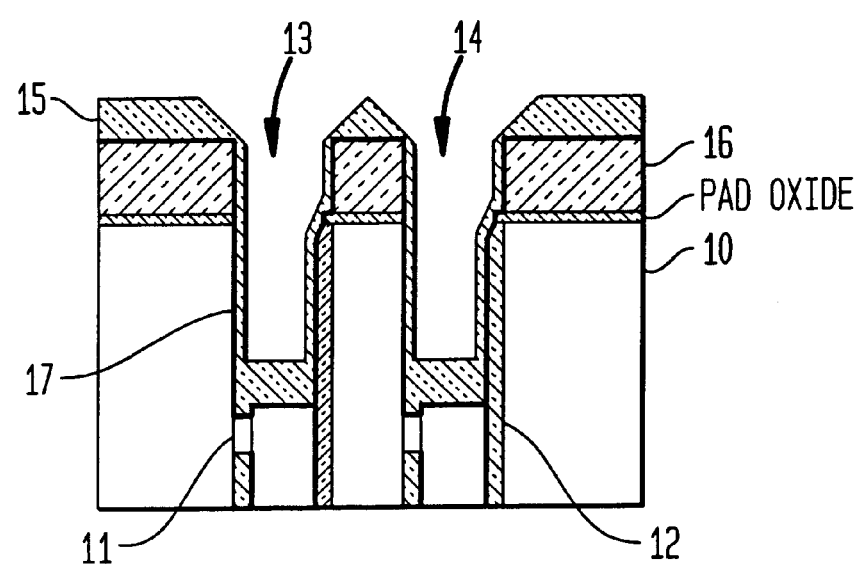

Referring now to the drawings, and more particularly to FIGS. 1 to 6, there is shown the basic sequence and the resulting structure of this invention. FIGS. 1A and 1B show, respectively, a top view and a cross-sectional view of a portion of a semiconductor structure which has been processed by previous conventional processing steps to produce a one-sided buried strap and collar in the device recess. A one-sided buried strap 11 and an oxide collar 12 are formed in device recesses 13 and 14 previously formed in the silicon substrate 10. After forming the one-sided buried strap 11 and collar 12 in the device recesses, the High Density Plasma (HDP) Trench Top Oxide (TTO) 15 is deposited over the pad nitride 16 and the TTO nitride barrier liner 17, the pad nitride 16 and the nitride barrier liner 17 covering the one-sided oxide collar in the device recesses having been formed in preceding processing steps.

Figure 2A:
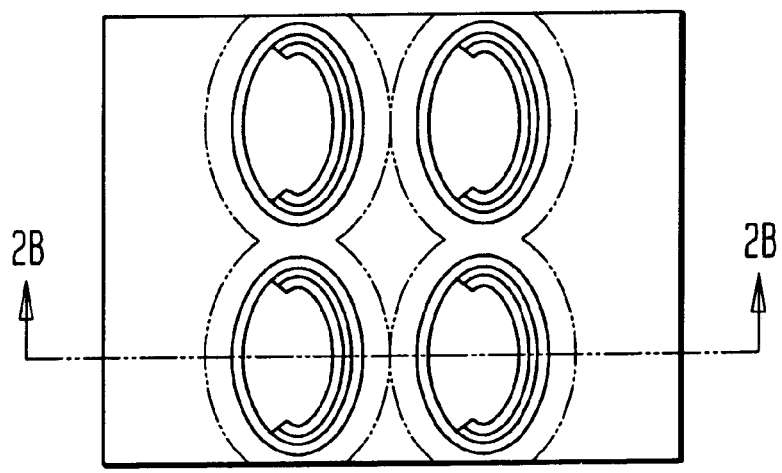
FIGS. 2A and 2B are, respectively, a top view and a cross-sectional view showing the etch of the excess HDP TTO to the TTO nitride liner.
Figure 2B:
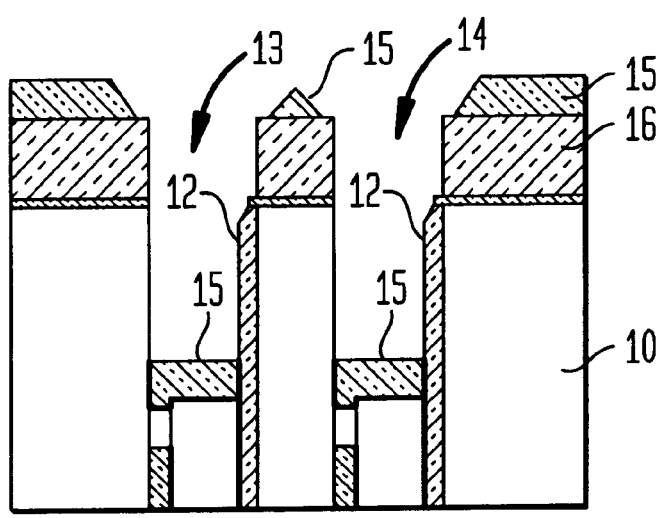

In FIGS. 2A and 2B, the TTO HDP oxide 15 is etched just enough to clear it from the sidewalls in the recesses 13 and 14. This etch is done selectively to the nitride barrier liner 17 covering the remaining collar oxide 12. The gate sacrificial oxide (sac ox) could also be removed during this etch step. Alternatively, it can be grown and stripped away later or skipped altogether. The nitride barrier liner from previous steps may or may not be removed after the oxide etch.

Figure 3A:
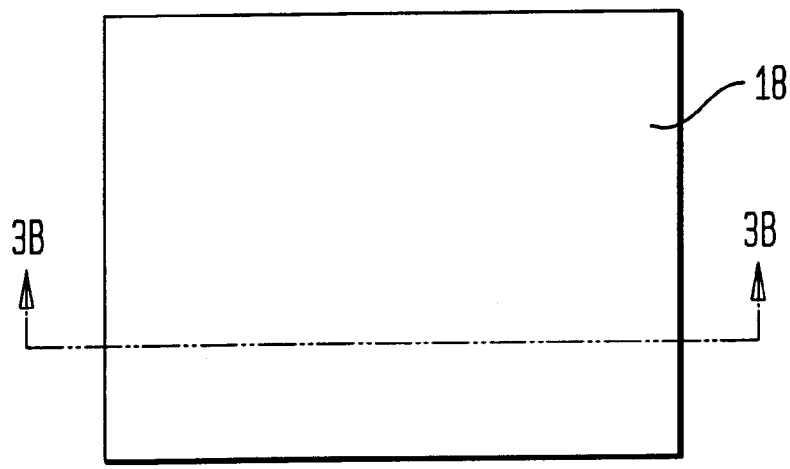
FIGS. 3A and 3B are, respectively, a top view and a cross-sectional view showing the formed gate.
Figure 3B:
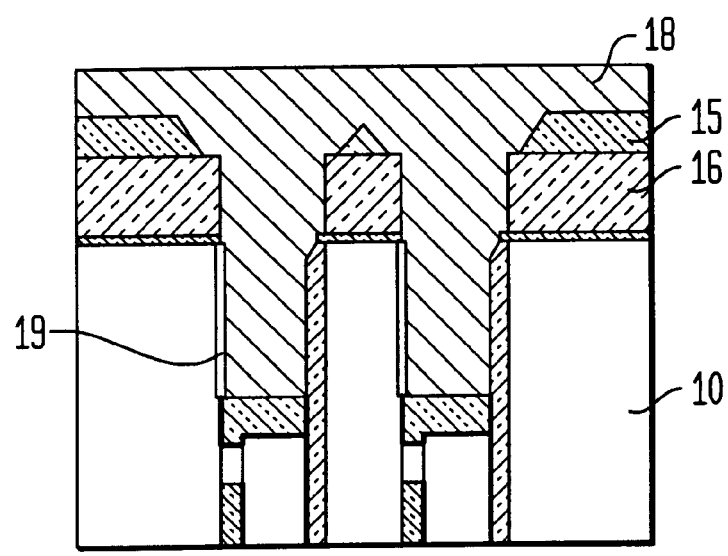

FIGS. 3A and 3B show the gate formed as usual. This includes growing the gate oxide 19 and overfilling the recesses with amorphous silicon (a-Si) or polysilicon 18. If needed, a sacrificial oxide could be grown and stripped away just prior to gate oxidation to prepare the vertical silicon surface for gate oxidation.

Figure 4A:
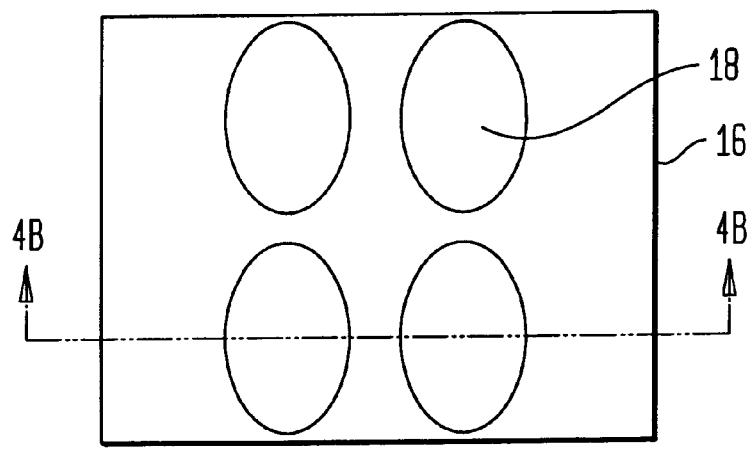
FIGS. 4A and 4B are, respectively, a top view and a cross-sectional view showing the excess gate polysilicon and the TTO oxide on top of the pad nitride removed down to the surface the pad nitride.
Figure 4B:
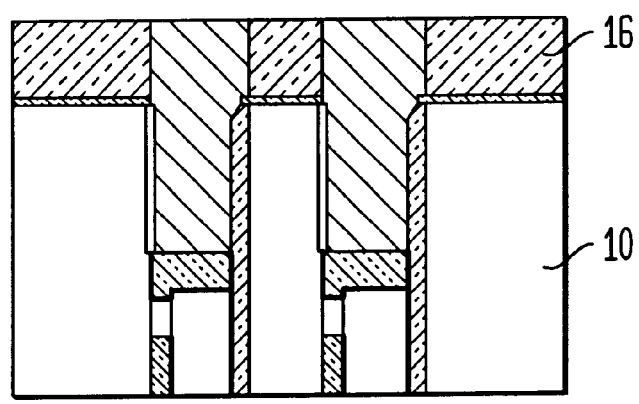

FIGS. 4A and 4B show the excess gate a-Si or polysilicon and TTO oxide on top of the pad nitride removed down to the surface of the pad nitride 16. Chemical-mechanical polishing (CMP), wet etching, dry etching, or some combination of these techniques may be used to remove the oxide.

Figure 5A:
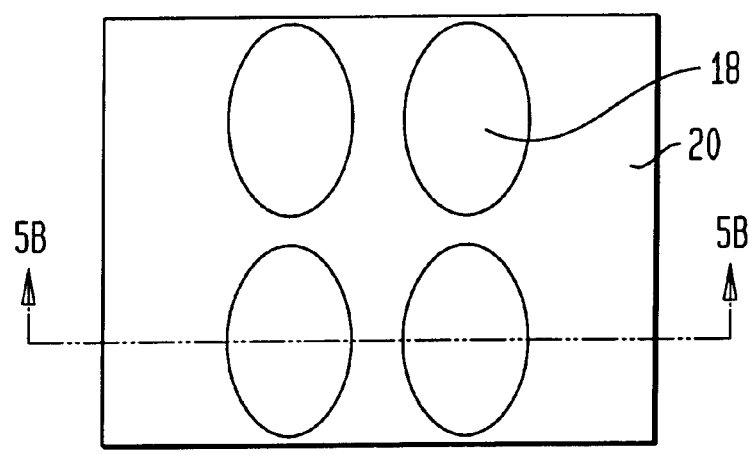
FIGS. 5A and 5B are, respectively, a top view and a cross-sectional view showing the pad nitride stripped from the top surface selective to the pad oxide and the polysilicon plugs extending above the silicon surface.
Figure 5B:
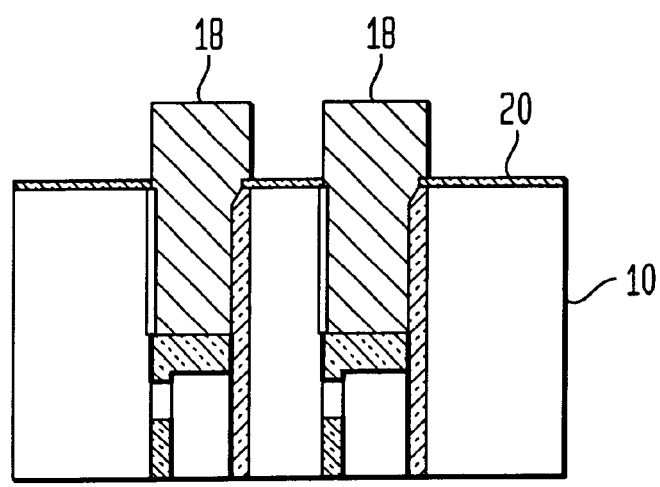

In the next step, shown in FIGS. 5A and 5B, the pad nitride is stripped from the top surface selective to the pad oxide 20 and the polysilicon plugs 18 extending above the silicon surface. The polysilicon plugs 18 define the form for the subsequent oxide deposition. If desired, this form could be modified by additional processing steps such as an isotropic wet or dry silicon etch to reduce the size of the exposed top part of the plug. This would be done to facilitate the integration with subsequent processing (e.g., formation of the gate interconnects and formation of the source junction contacts).

Figure 6A:
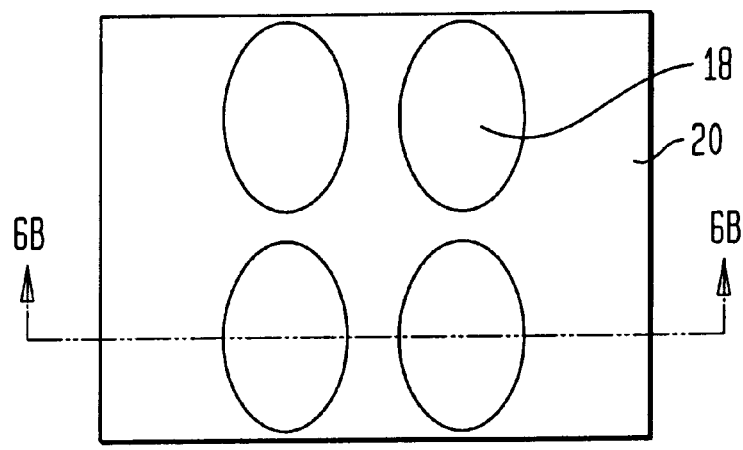
FIGS. 6A and 6B are, respectively, a top view and a cross-sectional view showing the deposited Top Oxide which has been planarized down to the tops of the polysilicon plugs.
Figure 6B:
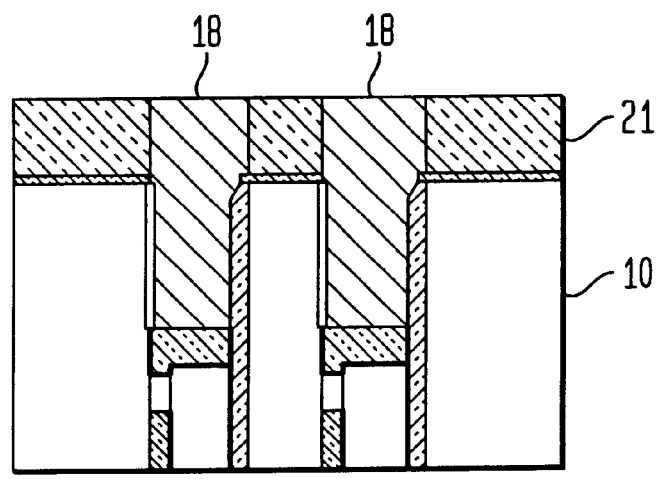

Finally, as shown in FIGS. 6A and 6B, the Top Oxide 21 is deposited by HDP or some other oxide deposition technique. The oxide 21 fills the gaps between the polysilicon plugs 18 and can also cover them. CMP or a wet or dry etch-back removes the oxide from the tops of the plugs without over-etching too much outside of the array. The combination of HDP deposition and oxide CMP is the preferred implementation of this step.

Figure 7:
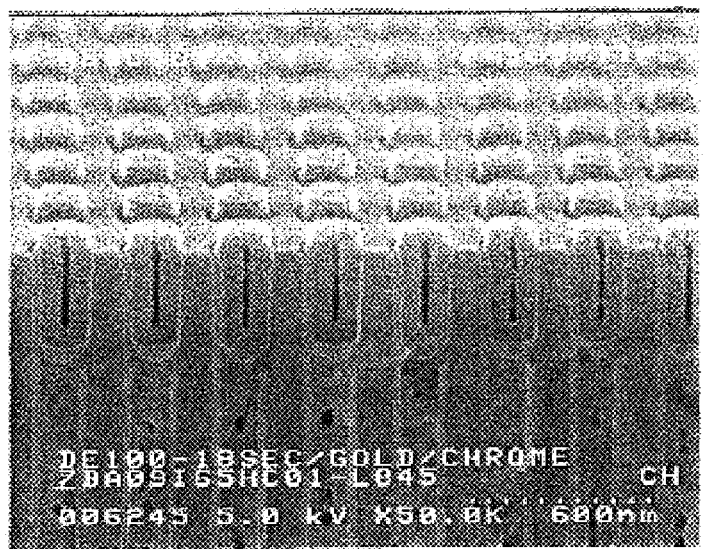
FIG. 7 is a microphotograph providing a perspective view of the top surface and cross-section after the pad nitride has been stripped and before the Top Oxide deposition.
Figure 8:
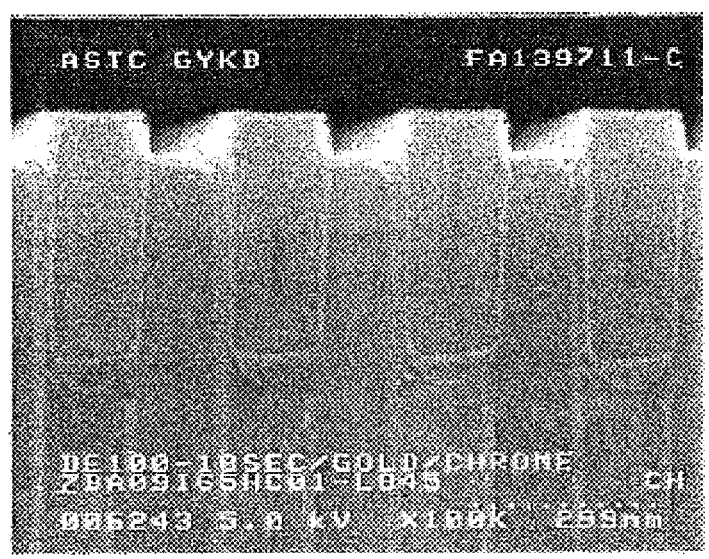
FIG. 8 is a microphotograph of higher magnification showing a view of the cross-section after stripping the pad nitride.
Figure 9:
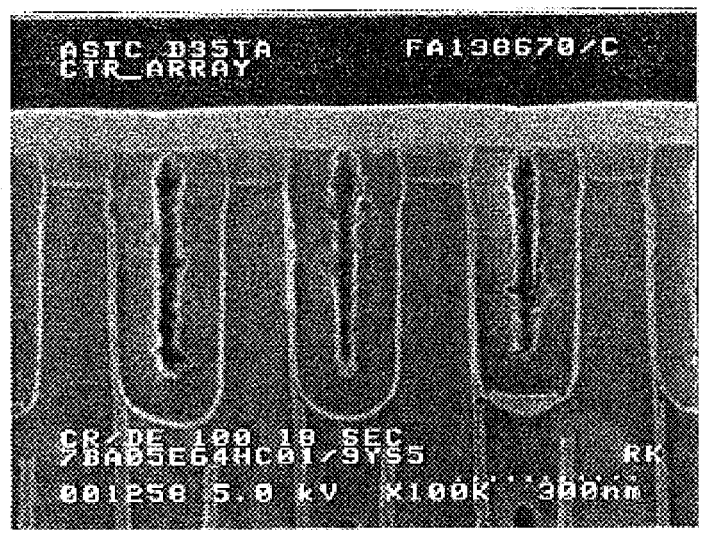
FIG. 9 is a microphotograph showing the resulting structure of the Top Oxide Method according to the invention.
Figure 10:
FIG. 10 is a microphotograph showing the Top Oxide outside the array in an unpatterned region on the same chip shown in FIG. 9.

FIG. 7 is a scanning electron microscope (SEM) microphotograph showing a perspective view of the top surface and cross section of the device after the pad nitride has been stripped and before the Top Oxide deposition. FIG. 8 is a higher magnification SEM microphotograph showing a view of the cross-section after the pad nitride strip. FIG. 9 is a SEM microphotograph showing the resulting structure of the Top Oxide Method according to the invention. The top layer seen in the microphotograph is a chrome capping layer deposited for image enhancement. The SEM microphotograph shown in FIG. 10 shows the Top Oxide outside of the array in an unpatterned region on the same chip shown in FIG. 9. The microphotograph shows nearly the same oxide thickness in these unpatterned regions as is seen in the array. This indicates very little dishing of the HDP oxide across the chip. This capability of the HDP/CMP combination is the preferred implementation of the method.

Figure 11:
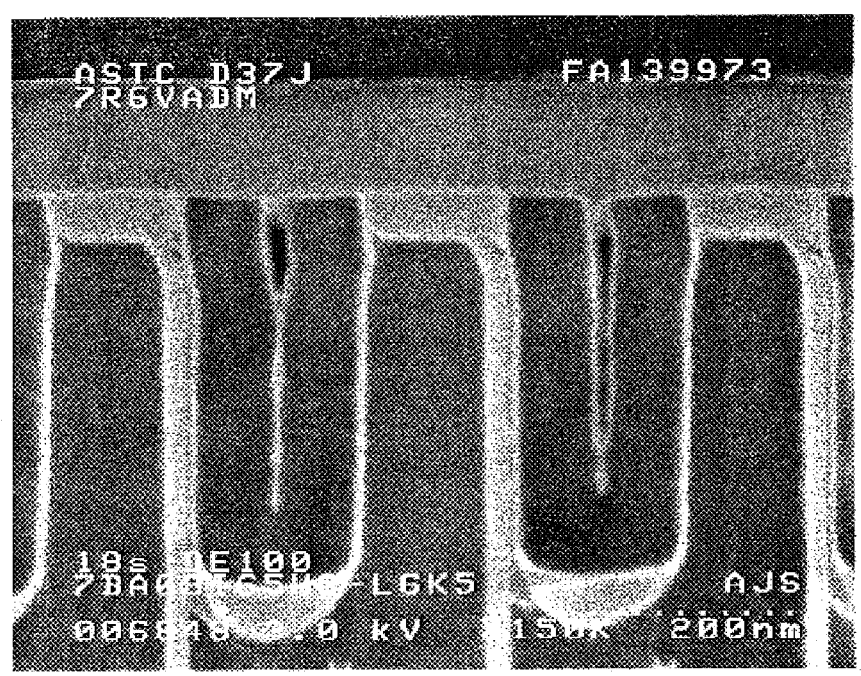
FIG. 11 is a microphotograph of higher magnification showing the details of the Top Oxide structure in which the gate polysilicon plugs extend to the top surface of the Top Oxide so contact can be easily made to the interconnects which would be subsequently fabricated.

FIG. 11 shows the structural details of the Top Oxide according to the present invention. In this figure, there is a silicon nitride capping layer used for image enhancement. The structure produced as shown in FIG. 11 is a square edged oxide surrounding the gate polysilicon plugs. It is primarily this square edge which makes the process according to the invention extendible to shrinking ground rules. The process is flexible since the Top Oxide thickness is determined by the thickness of the pad nitride that can be freely adjusted. In addition, the method of this invention lends itself to additional process options such as vertical gate pull-back, vertical gate nitride spacers, and a TTO nitride liner.

In FIGS. 12 to 15, there is shown an alternate sequence to the process according to the invention. In this sequence, the insulation trenches (ITs) are formed with the pad nitride in place and the Top Oxide is formed after IT processing.

Figure 12A:
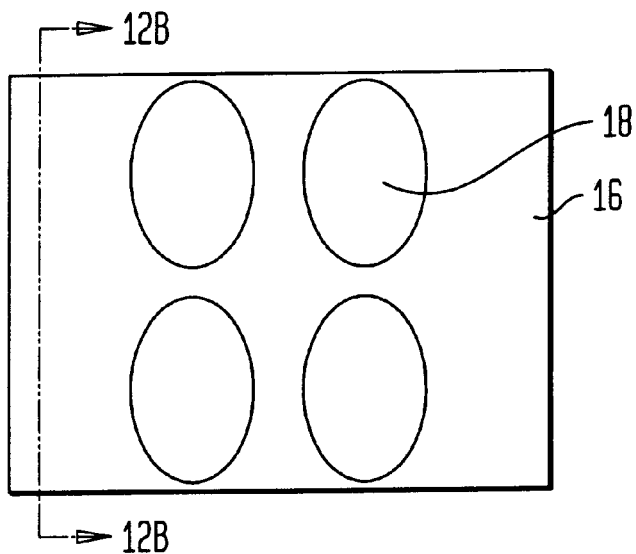
FIGS. 12A and 12B are, respectively, a top view and an orthogonal cross-sectional view showing the structure corresponding to FIGS. 4A and 4B (after vertical device formation and gate polysilicon planarization down to the pad nitride) as the starting point for isolation trench (IT) formation using the pad nitride.
Figure 12B:
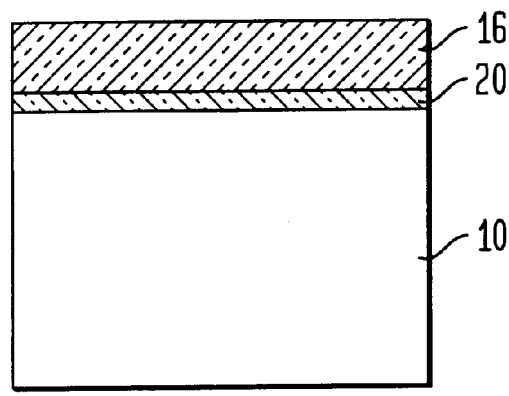

The starting point for this alternate sequence is where the isolation trenches have been formed with the pad nitride 16 still in place is that shown in FIGS. 12A and 12B. This structure corresponds exactly to that in FIGS. 4A and 4B (that is, after the vertical device has been fabricated and the gate polysilicon 18 has been planarized back to the pad nitride 16). All steps up to this point would be identical to those already described.

Figure 13A:
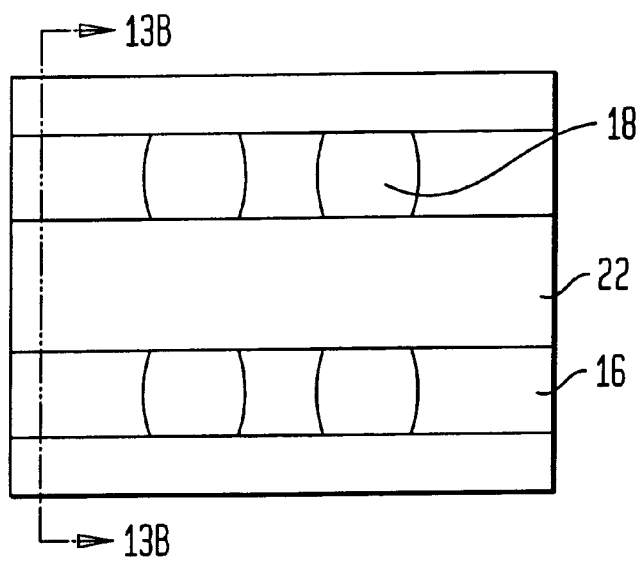
FIGS. 13A and 13B are, respectively, a top view and an orthogonal cross-sectional view showing the isolation trenches after they have been etched, filled with oxide and planarized back to the top of the pad nitride.
Figure 13B:
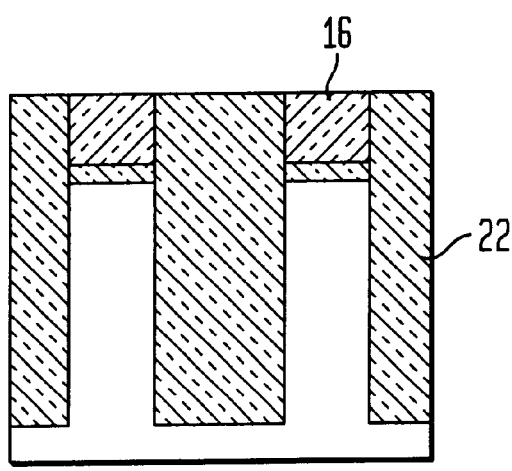

The next series of steps are the standard sequence for isolation trench (IT) formation. FIGS. 13A and 13B illustrate the structure after the isolations trenches have been patterned lithographically, etched using silicon reactive ion etching (RIE), filled with oxide, and the IT oxide 22 has been CMP planarized back to the top of the pad nitride.

Figure 14A:
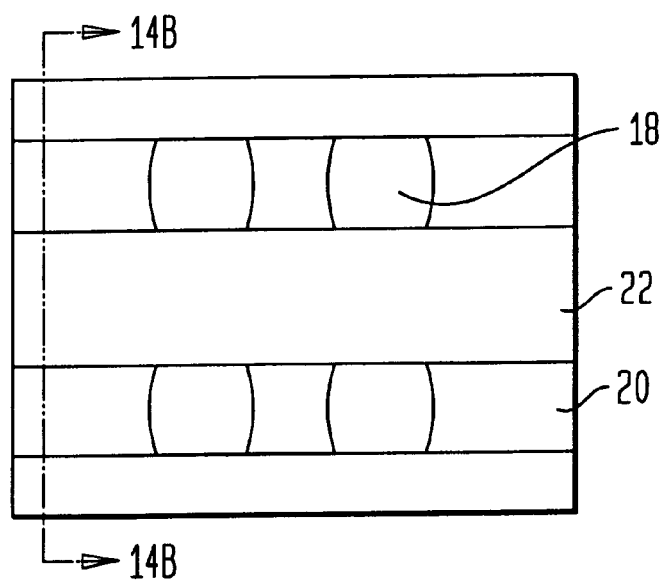
FIGS. 14A and 14B are, respectively, a top view and an orthogonal cross-sectional view showing the pad nitride stripped from the top surface selective to the pad oxide, the IT oxide, and the poly-Si plugs which extend above the silicon surface.
Figure 14B:
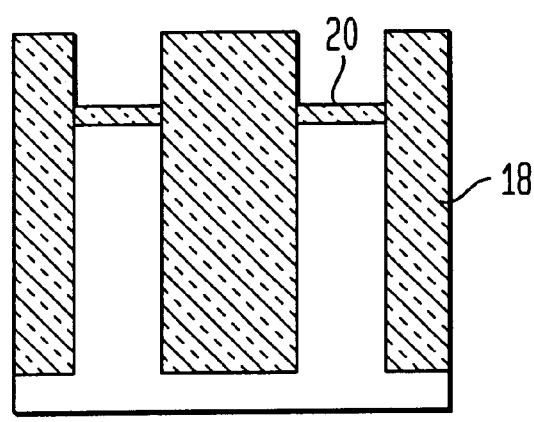

In the next step, shown in FIGS. 14A and 14B, the pad nitride is stripped from the top surface selective to the pad oxide 20, the IT oxide 22, and the polysilicon plugs 18 that extend above the silicon surface. The polysilicon plugs 18 and the IT pattern define the pattern for the subsequent oxide deposition. If desired, this pattern could be adjusted by an additional process step such as an isotropic wet or dry silicon etch to reduce the size of the exposed top part of the polysilicon plugs 18. This would be done to facilitate the integration with subsequent processing steps (e.g., formation of the gate interconnects and formation of the source junction contacts).

Figure 15A:
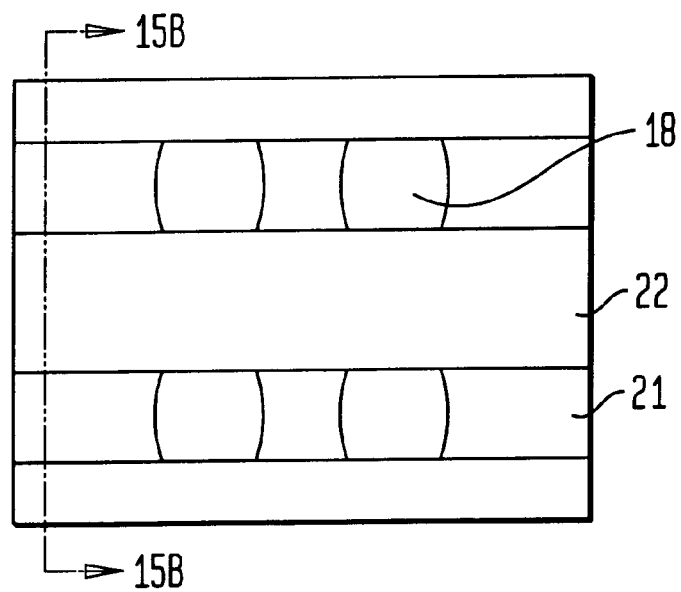
FIGS. 15A and 15B are, respectively, a top view and an orthogonal cross-sectional view showing the deposited Top Oxide that has been planarized to the tops of the polysilicon plugs.
Figure 15B:
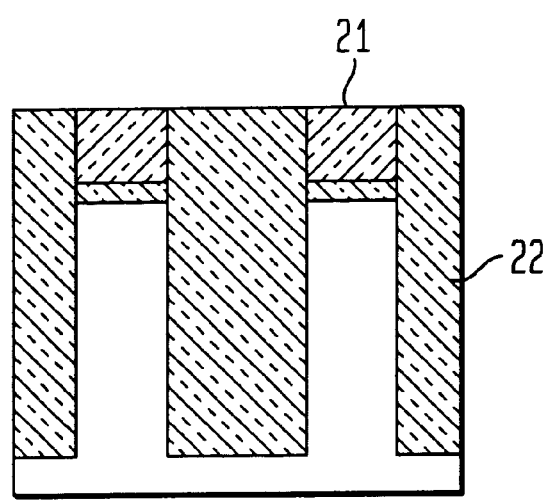

Finally, as shown in FIGS. 15A and 15B, the Top Oxide 21 is deposited by HDP oxide deposition or by some other oxide deposition technique. The oxide fills the gaps between the polysilicon plugs 18 and can also cover them. It also fills in the regions between the IT oxide 22 which also extends above the silicon surface. CMP or a wet or dry etch-back removes the oxide to the tops of the plugs 18 without over-etching too much outside of the array. The combination of HDP oxide deposition and oxide CMP is the preferred implementation of this step.

While the invention has been described in terms of preferred embodiments, those skilled in the art will recognize that the invention can be practiced with modification within the spirit and scope of the appended claims.

Having thus described our invention, what we claim as new and desire to secure by letters patent is as follows:

1. A process for forming an oxide layer (Top Oxide) over an array of vertical transistors in a silicon substrate and conducting lines used to connect the vertical transistors with self-aligned gate contacts of the vertical transistors comprising the steps of:

depositing a Trench Top Oxide (TTO)with a pad nitride in place using a high density plasma (HDP) process;

forming a gate oxide and gate amorphous silicon or polycrystalline silicon within recesses of the silicon substrate followed by removing the HDP oxide on the top of the pad nitride, with the gate amorphous silicon or polycrystalline silicon protecting structures inside the vertical device;

planarizing the gate amorphous silicon or polycrysatlline silicon back to the pad nitride;

then etching the pad nitride away selective to the gate amorphous silicon or polycrystalline silicon and oxide on the silicon substrate surface to form self-aligned gate amorphous silicon or polycrystalline silicon plugs projecting above the silicon substrate surface; and depositing a top oxide filling spaces in between the amorphous silicon or polycrystalline silicon plugs.

2. The method of claim 1, wherein the deposited top oxide covers the gate amorphous silicon or polycrystalline silicon plugs which extend above the silicon substrate surface, further comprising the step of planarizing the deposited top oxide to the tops of the gate amorphous silicon or polycrystalline silicon plugs.

3. The method of claim 1, wherein the pad nitride is deposited to a thickness which corresponds to a desired thickness of the top oxide which is deposited after the pad nitride is etched away.

4. The method of claim 1, wherein prior to etching the pad nitride away, further comprising the steps of:

etching isolation trenches between the amorphous silicon or polycrystalline silicon deposited within recesses of the silicon substrate; and filling the isolation trenches with an oxide.

5. The method of claim 4, further comprising the step of planarizing the oxide within the isolation trenches to the pad nitride.

6. A process for forming an oxide layer (Top Oxide) with self-aligned gate contacts between vertical metal oxide semiconductor field effect transistor (MOSFET) array and an interconnect layer used to interconnect gates of the MOSFETs comprising the steps of:

forming the vertical MOSFETs in a silicon substrate with a silicon nitride pad layer covering a surface of the silicon substrate;

clearing all material from a top surface of the silicon nitride pad layer;

stripping away the silicon nitride pad layer selective to gate polycrystalline silicon (polysilicon) and a pad oxide under the silicon nitride pad layer;

depositing an oxide layer (Top Oxide) over and between gate polysilicon extensions which extend out of the silicon substrate; and planarizing the deposited oxide until a top surface of the deposited oxide is planar with tops of the gate polysilicon extensions.

7. The process of claim 6, further comprising the step of forming trench capacitors in the silicon substrate, the vertical MOSFETs being formed so as to be vertically stacked above the trench capacitors for form a trench dynamic random access memory (DRAM) array.

8. The process of claim 6, wherein the step of planarizing is performed by chemical-mechanical polishing (CMP).

9. The process of claim 6, wherein the step of planarizing is performed by etching.

10. The process of claim 6, further comprising the step of forming isolation trenches in the silicon substrate before the silicon nitride pad layer is stripped away and after the gate polysilicon is planarized back to the surface of the silicon nitride pad layer.

11. The process of claim 10, wherein the step of forming isolation trenches comprises the steps of:

patterning the isolation trenches;

anisotropically etching the isolation trenches into the substrate;

filling the isolation trenches with an insulating material by a combination of oxidation and deposition;

planarizing the deposited oxide back to a top surface of the silicon nitride pad layer.

12. The process of claim 6, wherein a thickness of the Top Oxide layer can be adjusted by adjusting a starting thickness of the silicon nitride pad layer.

13. The process of claim 6, wherein the gate polysilicon extensions are exposed after stripping the silicon nitride pad layer such that the gate polysilicon extensions can be acted on by additional processing techniques to modify their shape and size before the Top Oxide layer is deposited.

14. The process of claim 6, wherein the gate polysilicon extensions are exposed after stripping the silicon nitride pad layer such that a combination of shaping by additional processing and application of a silicon nitride spacer can be used before the Top Oxide layer is deposited.

* * * * *

UNITED STATES PATENT AND TRADEMARK OFFICE
CERTIFICATE OF CORRECTION

PATENT NO. : 6,794,242 B1
DATED : September 21, 2004
INVENTOR(S) : Dyer et al.

It is certified that error appears in the above-identified patent and that said Letters Patent is hereby corrected as shown below:

Title page,
Item [75], Inventors, replace "Arnod" with -- Arnold --

Signed and Sealed this

Ninth Day of August, 2005

JON W. DUDAS
*Director of the United States Patent and Trademark Office*